(12) United States Patent
Zhu et al.

(10) Patent No.: US 10,984,208 B2
(45) Date of Patent: Apr. 20, 2021

(54) DISPLAY PANEL AND DISPLAY DEVICE (71) Applicants: BOE Technology Group Co., Ltd., Beijing (CN); Hefei Xinsheng Optoelectronics Technology Co., Ltd., Anhui (CN)

(72) Inventors: Ruhui Zhu, Beijing (CN); Gu Yao, Beijing (CN); Qinghua Zou, Beijing (CN); Yu Wang, Beijing (CN); Tingyuan Duan, Beijing (CN); Suwei Zeng, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 16/310,621

(22) PCT Filed: Jun. 22, 2018

(86) PCT No.: PCT/CN2018/092468
§ 371 (c)(1),
(2) Date: Mar. 7, 2019

(87) PCT Pub. No.: WO2019/052253
PCT Pub. Date: Mar. 21, 2019

(65) Prior Publication Data
US 2019/0340409 A1 Nov. 7, 2019

(30) Foreign Application Priority Data
Sep. 15, 2017 (CN) .......................... 201710831410.4

(51) Int. Cl.
*G06K 9/00* (2006.01)
*H01L 27/32* (2006.01)
*H01L 51/52* (2006.01)

(52) U.S. Cl.
CPC ........ *G06K 9/00006* (2013.01); *H01L 27/326* (2013.01); *H01L 27/3211* (2013.01); *H01L 51/5206* (2013.01); *H01L 51/5221* (2013.01)

(58) Field of Classification Search
CPC .............. G06K 9/00006; G06K 9/0004; H01L 27/3211; H01L 27/326; H01L 51/5206;
(Continued)

(56) References Cited

U.S. PATENT DOCUMENTS

2011/0043487 A1 2/2011 Huang et al.
2011/0169779 A1 7/2011 Boer et al.
(Continued)

FOREIGN PATENT DOCUMENTS

| CN | 105807521 A | 7/2016 |
|----|-------------|--------|
| CN | 106355136 A | 1/2017 |

(Continued)

OTHER PUBLICATIONS

International Search Report for PCT/CN2018/092468 dated Sep. 11, 2018.
(Continued)

*Primary Examiner* — Abhishek Sarma
(74) *Attorney, Agent, or Firm* — Arent Fox LLP; Michael Fainberg (57) ABSTRACT

The disclosure discloses a display panel and a display device to thereby extend an area for recognizing a fingerprint or a palmprint instead of only a fixed area in which a fingerprint can be recognized as in the related art, so as to recognize a fingerprint or a palmprint throughout the screen while improving the precision of recognizing light rays. The display panel according to the disclosure includes: a base substrate; and, infrared light sources, pixel units, and infrared photosensitive sensors on the base substrate.

13 Claims, 6 Drawing Sheets

(58) Field of Classification Search
CPC ............... H01L 51/5221; H01L 27/288; H01L 27/3234; H01L 27/3227; H01L 27/323; H01L 51/50
See application file for complete search history.

(56) References Cited

U.S. PATENT DOCUMENTS

| | | | | |
|---|---|---|---|---|
| 2012/0146953 | A1* | 6/2012 | Yi ........................ | G06F 3/0412 345/175 |
| 2013/0075761 | A1* | 3/2013 | Akiyama ............. | A61B 5/1455 257/80 |
| 2013/0201085 | A1* | 8/2013 | Chang .................. | G06F 3/0412 345/76 |
| 2015/0331508 | A1* | 11/2015 | Nho ...................... | H01L 27/323 345/173 |
| 2017/0123542 | A1* | 5/2017 | Xie ...................... | H01L 27/3227 |
| 2017/0278909 | A1* | 9/2017 | Jeon ..................... | A61B 5/1171 |
| 2018/0188583 | A1 | 7/2018 | Liu et al. | |
| 2018/0211079 | A1 | 7/2018 | Liu et al. | |
| 2018/0299982 | A1 | 10/2018 | Liu et al. | |
| 2019/0013368 | A1* | 1/2019 | Chung ................ | H01L 27/3234 |

FOREIGN PATENT DOCUMENTS

| | | |
|---|---|---|
| CN | 106653802 A | 5/2017 |
| CN | 107045628 A | 8/2017 |
| JP | 2009288956 A | 12/2009 |
| KR | 20090065182 A | 6/2009 |

OTHER PUBLICATIONS

Office Action issued in Korean 10-2018-7034051 dated Nov. 15, 2019.
European Search Report for EO18812019.0 dated Mar. 18, 2020.
Notice of Allowance for Korean application No. 10-2018-7034051 dated May 7, 2020.

\* cited by examiner

DISPLAY PANEL AND DISPLAY DEVICE

This application is a National Stage of International Application No. PCT/CN2018/092468, filed Jun. 22, 2018, which claims priority to Chinese Patent Application No. 201710831410.4, filed Sep. 15, 2017, both of which are hereby incorporated by reference in their entireties.

FIELD

This disclosure relates to the field of display technologies, and particularly to a display panel and a display device.

BACKGROUND

An Active-Matrix Organic Light-Emitting Diode (AMOLED) panel characterized in high contrast, a wide color gamut, a high response speed, flexibility, etc., has been undergoing popular commercialization in the industry of flat panels, and is expected to be the most promising competitor among future display technologies.

The AMOLED panel is inevitably coming to being applied to a display of a mobile phone, and the display of the mobile phone is also becoming full-screen as pursued in the industry, so it is desirable to recognize a fingerprint or a palmprint on a front face of the mobile phone with the full-screen display during man-machine interaction. In the related art, only a fingerprint in a fixed area can be recognized, and an additional backlight has to be arranged separately, or an integrated micro light-emitting diode (LED) has to be configured, as a recognition light source, thus complicating an assembling process, discouraging the mobile phone from being low-weighted and portable, and hindering a fingerprint or a palmprint from being recognized throughout the screen.

SUMMARY

Embodiments of the disclosure provide a display panel and a display device in the following particular solutions.

Embodiments of the disclosure provide a display panel including: a base substrate; a plurality of pixel units on the base substrate; and, a plurality of infrared light sources and a plurality of infrared photosensitive sensors distributed between the plurality of pixel units, wherein an overlapping spectrum exists between an emission spectrum of each of the plurality of infrared light sources, and an absorption spectrum of each of the plurality of infrared photosensitive sensors.

Optionally, in the display panel above according to the embodiments of the disclosure, the plurality of infrared light sources include near infrared organic light-emitting diodes, and the plurality of infrared photosensitive sensors include near infrared photosensitive diodes.

Optionally, in the display panel above according to the embodiments of the disclosure, the plurality of pixel units include a plurality of organic light-emitting sub-pixels.

Optionally, in the display panel above according to the embodiments of the disclosure, each of the near infrared organic light-emitting diodes includes: a first electrode, a near infrared light-emitting layer, and a second electrode stacked on the base substrate in that order; each of the plurality of organic light-emitting sub-pixels includes a third electrode, a pixel light-emitting layer, and a fourth electrode stacked on the base substrate in that order; and the first electrode is arranged at a same layer as the third electrode, and the second electrode is arranged at a same layer as the fourth electrode.

Optionally, in the display panel above according to the embodiments of the disclosure, the second electrode is formed integrally with the fourth electrode.

Optionally, in the display panel above according to the embodiments of the disclosure, each of the near infrared organic light-emitting diodes includes a first electrode, a near infrared light-emitting layer, and a second electrode stacked on the base substrate in that order; each of the near infrared photosensitive diodes includes a fifth electrode, a near infrared photosensitive layer, and a sixth electrode stacked on the base substrate in that order; and the first electrode is arranged at a same layer as the fifth electrode.

Optionally, in the display panel above according to the embodiments of the disclosure, the second electrode is arranged at a same layer as the sixth electrode.

Optionally, in the display panel above according to the embodiments of the disclosure, the second electrode is formed integrally with the sixth electrode.

Optionally, in the display panel above according to the embodiments of the disclosure, the near infrared photosensitive diodes are located below the near infrared organic light-emitting diodes.

Optionally, in the display panel above according to the embodiments of the disclosure, each of the near infrared photosensitive diodes includes a fifth electrode, a near infrared photosensitive layer, and a sixth electrode stacked on the base substrate in that order; each of the near infrared organic light-emitting diodes includes a first electrode, a near infrared light-emitting layer, and a second electrode stacked on the base substrate in that order; and orthographic projections of respective near infrared photosensitive layers onto the base substrate cover orthographic projections of respective near infrared light-emitting layers onto the base substrate.

Optionally, in the display panel above according to the embodiments of the disclosure, the plurality of infrared light sources are distributed uniformly among the plurality of pixel units; and the plurality of infrared photosensitive sensors are distributed uniformly among the plurality of pixel units.

Optionally, in the display panel above according to the embodiments of the disclosure, the number of infrared photosensitive sensors is the same as the number of infrared light sources.

Optionally, in the display panel above according to the embodiments of the disclosure, the base substrate is a flexible substrate.

Optionally, in the display panel above according to the embodiments of the disclosure, an emission spectrum of each of the near infrared organic light-emitting diodes ranges from 780 nm to 2500 nm.

Correspondingly, the embodiments of the disclosure further provide a display device including the display panel according to any one of the embodiments above of the disclosure.

DETAILED DESCRIPTION OF THE EMBODIMENTS

In order to make the objects, technical solutions, and advantages of the disclosure more apparent, the disclosure will be described below in further details with reference to the drawings, and apparently the embodiments described below are only a part but not all of the embodiments of the disclosure. Based upon the embodiments here of the disclosure, all the other embodiments which can occur to those ordinarily skilled in the art without any inventive effort shall fall into the scope of the disclosure.

The shapes and sizes of respective components in the drawings are not intended to reflect any real proportion, but only intended to illustrate the disclosure of the disclosure.

Figure 1:
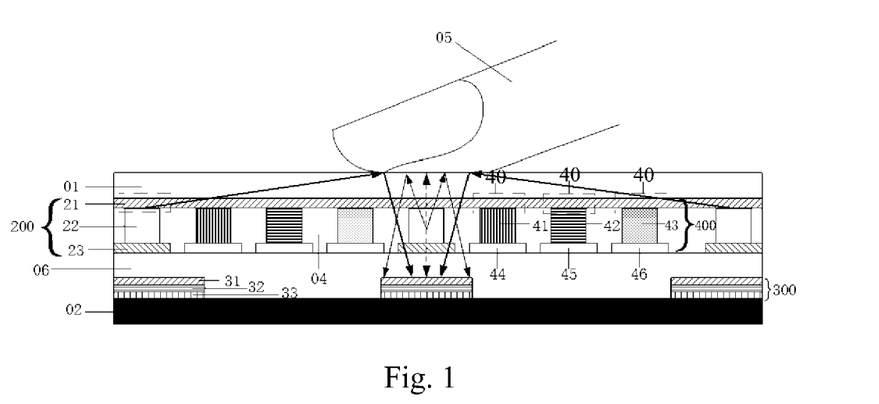
FIG. 1 is a first schematic structural diagram of a display panel according to the embodiments of the disclosure.
Figure 2:
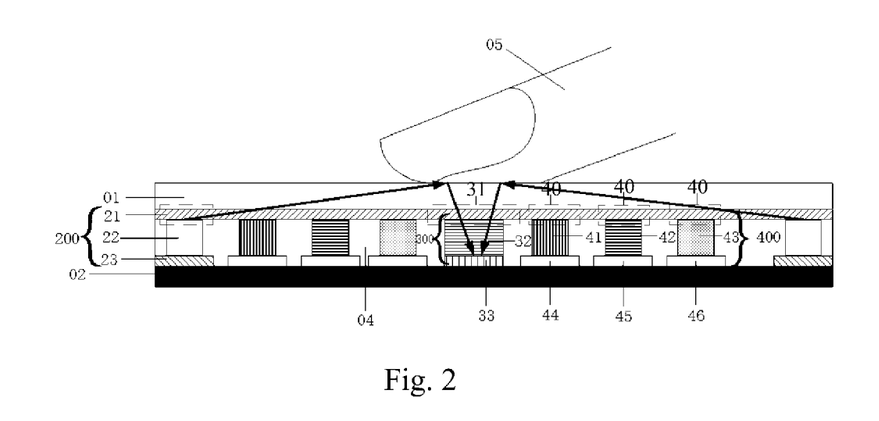
FIG. 2 is a second schematic structural diagram of the display panel according to the embodiments of the disclosure.

As illustrated in FIG. 1 and FIG. 2, a display panel according to the embodiments of the disclosure includes: a base substrate 02; a plurality of pixel units 400 on the base substrate 02; and, a plurality of infrared light sources, e.g., Near Infrared (NIR) Organic Light-Emitting Diodes (OLEDs) 200 as illustrated, and a plurality of infrared photosensitive sensors, e.g., near infrared photosensitive diodes 300 as illustrated, distributed between the plurality of pixel units 400; where there is an overlapping spectrum between an emission spectrum of each of the plurality of infrared light sources, and an absorption spectrum of each of the plurality of infrared photosensitive sensors.

In the display panel above according to the embodiments of the disclosure, if there is a wider overlapping spectrum between the emission spectrum of each of the plurality of infrared light sources, and the absorption spectrum of each of the plurality of infrared photosensitive sensors, then it will be more likely for the infrared photosensitive sensors to absorb energy of light rays from the near infrared light sources, and the energy will be transported more efficiently. Accordingly the wider the overlapping spectrum is, the better the effect is.

At present, a near infrared photosensitive sensor has been widely applied, and the technology thereof has been well developed, so optionally in the display panel above according to the embodiments of the disclosure, the infrared light sources can include the near infrared organic light-emitting diodes, and the infrared photosensitive sensors can include the near infrared photosensitive diodes, although the embodiments of the disclosure will not be limited thereto.

It shall be noted that the infrared light sources are the near infrared organic light-emitting diodes 200, and the infrared photosensitive sensors are the near infrared photosensitive diodes 300, as illustrated in the drawings of the disclosure by way of an example.

Optionally, in the display panel above according to the embodiments of the disclosure, an emission wavelength of each near infrared organic light-emitting diode 200 ranges from 780 nanometers to 2500 nanometers, for example, and since the wavelength of light visible to human eyes ranges from 380 nanometers to 780 nanometers, and light at a wavelength greater than 780 nanometers is invisible to human eyes, the emission spectrum of each near infrared organic light-emitting diode 200 is set between 780 nanometers and 2500 nanometers, so that the near infrared organic light-emitting diodes can emit light rays without hindering the display panel from displaying normally in operation.

Optionally, the display panel above according to the embodiments of the disclosure is an organic light-emitting panel. Of course, the display panel can alternatively be another type of panel, e.g., a liquid crystal display panel, a plasma display panel, electronic paper, etc., although the embodiments of the disclosure will not be limited thereto.

Optionally, the display panel above according to the embodiments of the disclosure is applicable to a flexible screen, or is applicable to a rigid screen, although the embodiments of the disclosure will not be limited thereto.

Particularly, FIG. 1 and FIG. 2 illustrates the display panel which is an organic light-emitting panel by way of an example, where 01 represents an upper substrate, 04 represents a pixel definition layer, 06 represents an insulation dielectric layer, and 05 represents a finger touching the screen, for example.

Particularly, the upper substrate 01 generally includes an encapsulation layer (and/or other existing structures, of course), and it shall be noted that, in a particular implementation, the upper substrate 01 which is an encapsulation layer may be dispensed with, but a thin layer may be formed directly above the base substrate 02 arranged in the structure above as an encapsulation layer.

Particularly, when the display panel is a flexible display panel, the base substrate 02 can be a flexible substrate (and/or other existing structures, of course); or in a particular implementation, when the display panel is a rigid panel, the base substrate 02 can include a glass substrate. Thin Film Transistors (TFTs), a driving circuit, and other structures, which are not illustrated, can be further formed on the base substrate, and they can be fabricated as in the related art, so a repeated description thereof will be omitted here.

Optionally, when the display panel above according to the embodiments of the disclosure is an organic light-emitting panel, each pixel unit 400 generally includes a plurality of organic light-emitting sub-pixels, for example, three organic light-emitting sub-pixels, which are a first organic light-emitting sub-pixel (e.g., a red (R) organic light-emitting sub-pixel), a second organic light-emitting sub-pixel (e.g., a green (G) organic light-emitting sub-pixel), and a third organic light-emitting sub-pixel (e.g., a blue (B) organic light-emitting sub-pixel). Of course, each pixel unit may further include a white organic light-emitting sub-pixel and/or a yellow organic light-emitting sub-pixel, etc., as needed in reality, although the embodiments of the disclosure will not be limited thereto.

Particularly, in the display panel above according to the embodiments of the disclosure, each organic light-emitting sub-pixel generally includes an anode, a pixel light-emitting layer, and a cathode, and a detailed description thereof will be omitted here.

For example, in the display panel above according to the embodiments of the disclosure, as illustrated in FIG. 1 and FIG. 2, each first organic light-emitting sub-pixel includes: a third electrode 44 of the first organic light-emitting sub-pixel, a pixel light-emitting layer 41 of the first organic light-emitting sub-pixel, and a fourth electrode 40 of the first organic light-emitting sub-pixel stacked on the base substrate 02 in that order; each second organic light-emitting sub-pixel includes: a third electrode 45 of the second organic light-emitting sub-pixel, a pixel light-emitting layer 42 of the second organic light-emitting sub-pixel, and a fourth electrode 40 of the second organic light-emitting sub-pixel stacked on the base substrate 02 in that order; and each third organic light-emitting sub-pixel includes: a third electrode 46 of the third organic light-emitting sub-pixel, a pixel light-emitting layer 43 of the third organic light-emitting sub-pixel, and a fourth electrode 40 of the third organic light-emitting sub-pixel stacked on the base substrate 02 in that order.

Optionally, in the display panel above according to the embodiments of the disclosure, each near infrared organic light-emitting diode 200 generally includes: a first electrode 23, a near infrared light-emitting layer 22, and a second electrode 21 stacked on the base substrate 02 in that order. That is, the near infrared organic light-emitting diodes 200 generally differ from the organic light-emitting sub-pixels in materials of the light-emitting layers, and generally since the light-emitting layers emit different light, the materials of the light-emitting layers are different.

Optionally, in the display panel above according to the embodiments of the disclosure, each first electrode 23 is arranged at the same layer as respective third electrodes (44, 45, and 46), and each second electrode 21 is arranged at the same layer as respective fourth electrodes 40, so that first electrodes 23 and the third electrodes (44, 45, and 46) can be formed in the same patterning process, and second electrodes 21 and the fourth electrodes 40 can be formed in the same patterning process, thus reducing the number of process operations, and lowering a fabrication cost.

Optionally, in the display panel above according to the embodiments of the disclosure, the fourth electrode 40 in each organic light-emitting sub-pixel is generally a common electrode to which fixed voltage is applied, and the second electrode 21 in each near infrared organic light-emitting diode is generally also a common electrode, so respective organic light-emitting sub-pixels and respective near infrared organic light-emitting diodes may share a common electrode as illustrated in FIG. 1 and FIG. 2, that is, the second electrodes 21 are formed integrally with the fourth electrodes 40, thus making the structure more simple and easier to fabricate in a simpler process. Of course, their electrodes can alternatively be arranged respectively.

Optionally, in the display panel above according to the embodiments of the disclosure, each near infrared photosensitive diode 300 includes: a fifth electrode 33, a near infrared photosensitive layer 32, and a sixth electrode 31 stacked on the base substrate 02 in that order.

Optionally, in a particular implementation, in the display panel above according to the embodiments of the disclosure, the first electrodes 23, the second electrodes 21, the fourth electrodes 40, and sixth electrodes 31 can be transparent electrodes, for example, to thereby improve the transmittance thereof.

In the display panel above according to the embodiments of the disclosure, as illustrated in FIG. 1 and FIG. 2, when the screen is not shielded by any object, that is, when the user has not performed any touch operation, light rays emitted by the near infrared organic light-emitting diodes 200 are reflected to the near infrared photosensitive diodes 300 over an unvarying light path; and when a finger 05 touches the screen, a light-shielding area is formed on the screen due to the finger 05, and when the light rays emitted by the near infrared organic light-emitting diodes 200 are incident on the light-shielding area formed on the screen due to the finger 05, the light rays reflect to the near infrared photosensitive diodes 300 over a varying light path (FIG. 1 illustrates three pairs of incident light paths and reflected light paths respectively in dotted lines, thin solid lines, and thick solid lines, and FIG. 2 illustrates two pairs of incident light paths and reflected light paths respectively in left and right thick solid lines), so the near infrared photosensitive diodes 300 can recognize a fingerprint or a palmprint according to the varying reflected light rays.

Following the principle above, furthermore in a particular implementation, in the display panel above according to the embodiments of the disclosure, the near infrared organic light-emitting diodes 200 and the near infrared photosensitive diodes 300 can be arranged in a number of positional relationships, although the embodiments of the disclosure will not be limited thereto.

Optionally, in the display panel above according to the embodiments of the disclosure, the near infrared photosensitive diodes 300 can be located below the near infrared organic light-emitting diodes 200, so that when the finger 05 touches the screen, the near infrared photosensitive diodes 300 are located right below the near infrared organic light-emitting diodes 200, so a force is applied to them with the same strength and at the same angle, that is, both of them are bent to the same extent, and have the same curvature radius, thus improving the precision of recognizing light rays.

Optionally, in the display panel above according to the embodiments of the disclosure, when the near infrared photosensitive diodes 300 are located below the near infrared organic light-emitting diodes 200, orthographic projections of respective near infrared photosensitive layers 32 onto the base substrate 02 cover orthographic projections of near infrared light-emitting layers 22 onto the base substrate 02, so that the near infrared photosensitive layers 32 can absorb more of light emitted by the near infrared light-emitting layers 22, thus improving the sensitivity to a touch.

Optionally, in the display panel above according to the embodiments of the disclosure, the near infrared organic light-emitting diodes 200 can alternatively be arranged at the same layer as the near infrared photosensitive diodes 300, that is, the first electrodes 23 of the near infrared organic light-emitting diodes 200 are arranged at the same layer as the fifth electrodes 33 of the near infrared photosensitive diodes 300, thus reducing the overall thickness of the display panel.

Optionally, in the display panel above according to the embodiments of the disclosure, the second electrodes 21 of the near infrared organic light-emitting diodes 200 are arranged at the same layer as the sixth electrodes 31 of the near infrared photosensitive diodes 300, so that the second electrodes 21 and the sixth electrodes 31 can be formed in the same patterning process to thereby simplify the fabrication process, and lower the production cost.

Optionally, in the display panel above according to the embodiments of the disclosure, the second electrodes 21 of the near infrared organic light-emitting diodes 200 are formed integrally with the sixth electrodes 31 of the near infrared photosensitive diodes 300, that is, one of the electrodes of each near infrared organic light-emitting diode 200, and one of the electrodes of each near infrared photosensitive diode 300 are a shared electrode.

Optionally, in the display panel above according to the embodiments of the disclosure, the plurality of infrared light sources are distributed uniformly between the plurality of pixel units, and the plurality of infrared photosensitive sensors are distributed uniformly between the plurality of pixel units, thus guaranteeing the uniformity of the precision of a touch.

The display panel according to the embodiments of the disclosure will be described below in connection with particular embodiments thereof.

Figure 3:
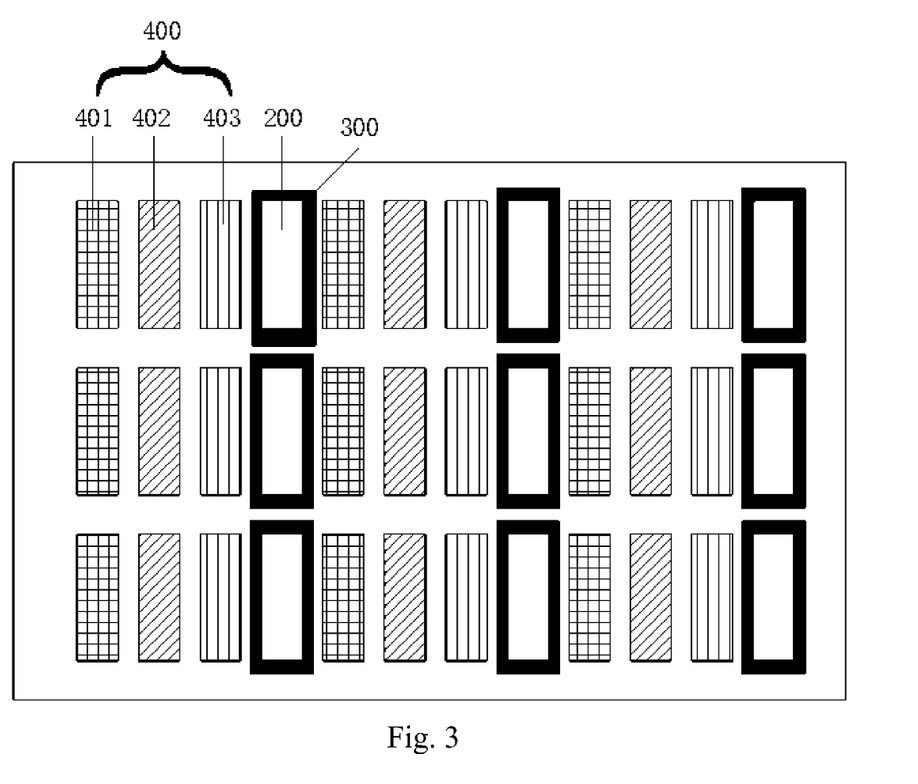
FIG. 3 is a first schematic diagram of arranged pixels in the display panel according to the embodiments of the disclosure.
Figure 4:
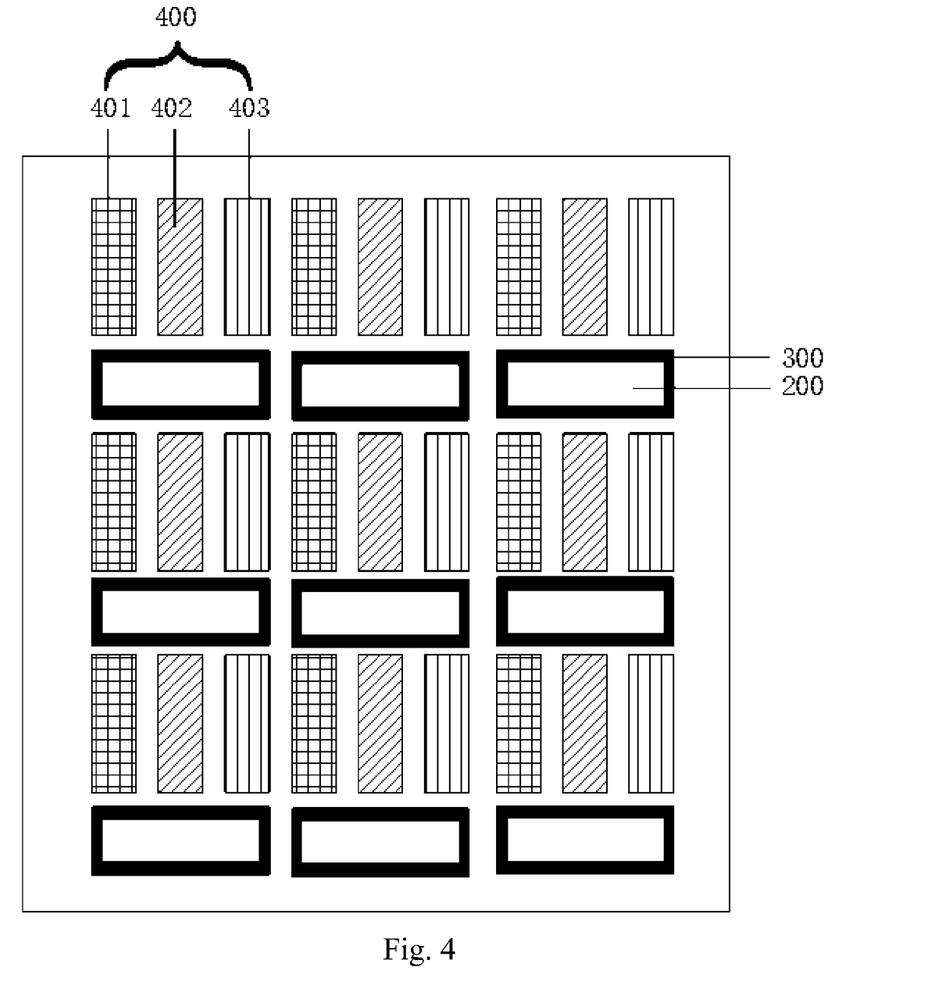
FIG. 4 is a second schematic diagram of arranged pixels in the display panel according to the embodiments of the disclosure.

Optionally, in the display panel according to a particular embodiment of the disclosure, as illustrated in FIG. 1, the near infrared organic light-emitting diodes 200 are arranged at the same layer as the pixel units 400, and each near infrared photosensitive diode 300 is arranged below one of the near infrared organic light-emitting diodes 200. Particularly, both the near infrared organic light-emitting diodes 200 and the pixel units 400 are arranged between the upper substrate 01 and the insulation dielectric layer 06, and separated from each other by the pixel definition layer 04 so that they are arranged to be spaced from each other, and each near infrared photosensitive diode 300 is arranged below the insulation dielectric layer 06. Where the near infrared organic light-emitting diodes 200 and the pixel units 400 are arranged to be spaced from each other so that as illustrated in FIG. 3, the pixel units 400 and the near infrared organic light-emitting diodes 200 are arranged alternately in each row, and for example, each of the pixel units 400 can include three organic light-emitting sub-pixels, e.g., a red organic light-emitting sub-pixel 401, a green organic light-emitting sub-pixel 402, and a blue organic light-emitting sub-pixel 403, so every two near infrared organic light-emitting diodes 200 are separated from each other by a red organic light-emitting sub-pixel 401, a green organic light-emitting sub-pixel 402, and a blue organic light-emitting sub-pixel 403; or as illustrated in FIG. 4, rows of the pixel units 400, and rows of the near infrared organic light-emitting diodes 200 are arranged alternately. The embodiments of the disclosure will not be limited thereto as long as the pixel units 400 and the near infrared organic light-emitting diodes 200 are arranged to be spaced from each other in a row direction or a column direction or both the row direction and the column direction, so that the pixel units 400 can arranged uniformly on the display panel, and the near infrared organic light-emitting diodes 200 can arranged uniformly on the display panel.

It shall be noted that, since respective near infrared organic light-emitting diodes 200 and respective pixel units 400 are structured in a plurality of layers, in the embodiments of the disclosure, they are arranged at the same layer so that their bottom layers proximate to the base substrate 02 are arranged at the same layer, and the other layers in their respective structures are formed on their respective bottom layers sequentially; and the number of layers in a structure of each near infrared organic light-emitting diode 200 and the number of layers in a structure of each pixel unit 400 may or may not be the same. For example, each near infrared organic light-emitting diode 200 is structured in three layers, and each pixel unit 400 is structured in three layers, so the corresponding layers in the three-layer structures of the near infrared organic light-emitting diodes 200 and the pixel units 400 are located at the same layers on the base substrate 02, that is, the bottom layers of the near infrared organic light-emitting diodes 200 are arranged at the same layer as the bottom layers of the pixel units 400, the intermediate layers of the near infrared organic light-emitting diodes 200 are arranged at the same layer as the intermediate layers of the pixel units 400, and the top layers of the near infrared organic light-emitting diodes 200 are arranged at the same layer as the top layers of the pixel units 400. And in another example, each near infrared organic light-emitting diode 200 is structured in three layers, and each pixel unit 400 is structured in four layers, so the three layers of each near infrared organic light-emitting diode 200 are arranged respectively at the same layers as the bottom layer, and the other two layers proximate to the bottom layer, of each pixel unit 400, and here the thicknesses of the respective layers will not be limited to any particular thicknesses, but only the positions at which and the order in which they are stacked have been illustrated.

Optionally, in the display panel above according to another particular embodiment of the disclosure, as illustrated in FIG. 2, all of the near infrared organic light-emitting diodes 200, the near infrared photosensitive diodes 300, and the pixel units 400 are arranged at the same layer, that is, all of the near infrared organic light-emitting diodes 200, the near infrared photosensitive diodes 300, and the pixel units 400 are arranged at the same layer between the upper substrate 01 and the base substrate 02. When the near infrared photosensitive diodes 300 and the near infrared organic light-emitting diodes 200 are arranged at the same layer, the thickness of the display panel can be further reduced.

Figure 5:
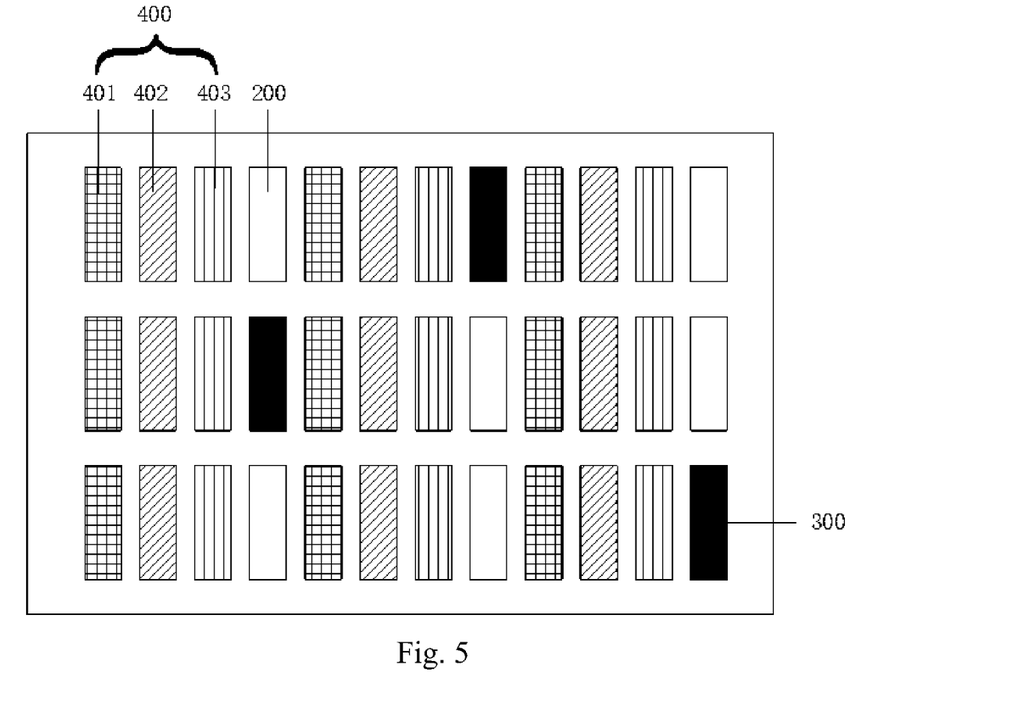
FIG. 5 is a third schematic diagram of arranged pixels in the display panel according to the embodiments of the disclosure.

Particularly, the near infrared organic light-emitting diodes 200, the near infrared photosensitive diodes 300, and the pixel units 400 can be arranged alternately to be spaced from each other, and they can be separated from each other by the pixel definition layer 04, or insulated from each other by an insulation layer, so that they can operate separately without being interfered with each other. Of course, they are substantially spaced or insulated from each other here, and in some embodiments of the disclosure, the near infrared organic light-emitting diodes 200, the near infrared photosensitive diodes 300, and the pixel units 400 can include some common components, e.g., electrodes, as long as their functional layers, e.g., the light-emitting layers or the near infrared photosensitive layers are spaced from each other so that they can operate separately. As illustrated in FIG. 5, they can be arranged alternately to be spaced from each other so that a near infrared organic light-emitting diode 200 or a near infrared photosensitive diode 300 is arranged between two sets of three sub-pixels of a pixel unit 400 (e.g., a red organic light-emitting sub-pixel 401, a green organic light-emitting sub-pixel 402, and a blue organic light-emitting sub-pixel 403), and a near infrared organic light-emitting diode 200 and a near infrared photosensitive diode 300 are arranged alternately between two sets of three sub-pixels of a pixel unit 400 in the row direction, or the near infrared organic light-emitting diodes 200 and the near infrared photosensitive diodes 300 are arranged at a quantity proportion of 1:2, so that the near infrared organic light-emitting diodes 200, the near infrared photosensitive diodes 300, and the pixel units 400 can be distributed uniformly on the display panel.

It shall be noted that, since respective near infrared organic light-emitting diodes 200, respective near infrared photosensitive diodes 300, and respective pixel units 400 are structured in a plurality of layers, in the embodiments of the disclosure, they are arranged at the same layer so that their bottom layers proximate to the base substrate 02 are arranged at the same layer, and the other layers in their respective structures are formed on their respective bottom layers sequentially; and respective numbers of layers in respective structures of each near infrared organic light-emitting diode 200, each near infrared photosensitive diode 300, and each pixel unit 400 may or may not be the same. For example, each near infrared organic light-emitting diode 200 is structured in three layers, each near infrared photosensitive diode 300 is structured in three layers, and each pixel unit 400 is structured in three layers, so the corresponding layers in the three-layer structures of the near infrared organic light-emitting diodes 200, the near infrared photosensitive diodes 300, and the pixel units 400 are located at the same layers on the base substrate 02, that is, the bottom layers of the near infrared organic light-emitting diodes 200, and the bottom layers of the near infrared photosensitive diodes 300 are arranged at the same layer as the bottom layers of the pixel units 400, the intermediate layers of the near infrared organic light-emitting diodes 200, and the intermediate layers of the near infrared photosensitive diodes 300 are arranged at the same layer as the intermediate layers of the pixel units 400, and the top layers of the near infrared organic light-emitting diodes 200, and the top layers of the near infrared photosensitive diodes 300 are arranged at the same layer as the top layers of the pixel units 400. And in another example, each near infrared organic light-emitting diode 200 is structured in three layers, each near infrared photosensitive diode 300 is structured in three layers, and each pixel unit 400 is structured in four layers, so the three layers of each near infrared organic light-emitting diode 200, and the three layers of each near infrared photosensitive diode 300 are arranged respectively at the same layers as the bottom layer, and the other two layers proximate to the bottom layer, of each pixel unit 400, and here the thicknesses of the respective layers will not be limited to any particular thicknesses, but only the positions at which and the order in which they are stacked have been illustrated.

Furthermore, as illustrated in FIG. 1 and FIG. 2, in the display panel above according to the embodiments of the disclosure, an insulation layer is further arranged between the upper substrate 01 and the base substrate 02 to insulate the near infrared organic light-emitting diodes 200, the near infrared photosensitive diodes 300, and the pixel units 400 from each other. In a particular implementation, when each near infrared photosensitive diode 300 is located below one of the near infrared organic light-emitting diodes 200, as illustrated in FIG. 1, the insulation layer includes a pixel definition layer 04 for insulating the near infrared organic light-emitting diodes 200 and the pixel units 400 from each other in a transverse direction, and an insulation dielectric layer 06 for insulating the near infrared organic light-emitting diodes 200, the pixel units 400 from the near infrared photosensitive diodes 300 in a longitudinal direction; and when the near infrared photosensitive diodes 300 are arranged at the same layer as the near infrared organic light-emitting diodes 200, as illustrated in FIG. 2, the insulation layer includes a pixel definition layer 04 for insulating the near infrared organic light-emitting diodes 200, the pixel units 400, and the near infrared photosensitive diodes 300 from each other in the traverse direction.

Furthermore, in the display panel above according to the embodiments of the disclosure, the near infrared organic light-emitting diodes 200 are arranged at the same layer as the pixel units 400. In a particular implementation, when each near infrared photosensitive diode 300 is located below one of the near infrared organic light-emitting diodes 200, the near infrared organic light-emitting diodes 200 and the pixel units 400 are arranged at the same layer above the insulation dielectric layer 06 as illustrated in FIG. 1; and when the near infrared photosensitive diodes 300 are arranged at the same layer as the near infrared organic light-emitting diodes 200, the near infrared organic light-emitting diodes 200 and the pixel units 400 are arranged at the same layer above the base substrate 02 as illustrated in FIG. 2.

Optionally, in the display panel above according to the embodiments of the disclosure, when the near infrared organic light-emitting diodes 200 are arranged at the same layer as the pixel units 400, the pixel units 400 can share the second electrodes 21 with the near infrared organic light-emitting diodes 200 as illustrated in FIG. 1, that is, the second electrodes 21 and the fourth electrodes 40 are an integral electrode.

Furthermore, in a particular implementation, in the display panel above according to the embodiments of the disclosure, when the near infrared photosensitive diodes 300 are arranged at the same layer as the near infrared organic light-emitting diodes 200, the pixel units 400 and the near infrared photosensitive diodes 300 can share the second electrodes 21 with the near infrared organic light-emitting diodes 200 as illustrated in FIG. 2, that is, the second electrodes 21 and the sixth electrodes 31 are an integral electrode.

Furthermore, in a particular implementation, in the display panel above according to the embodiments of the disclosure, the number of the infrared light sources and the number of the infrared photosensitive sensors can be set as needed, and for example, one infrared light source can be arranged corresponding to one infrared photosensitive sensor, that is, the number of the infrared photosensitive sensors is the same as the number of the infrared light sources, although the embodiments of the disclosure will not be limited thereto.

Optionally, in the display panel above according to the embodiments of the disclosure, a material of each near infrared organic light-emitting diode includes a binary compound of Terrylenediimide-Tetraphenylethene, a complex of Erbium (III), etc.

Optionally, in the display panel above according to the embodiments of the disclosure, the display panel includes a plurality of near infrared organic light-emitting diodes 200, a plurality of near infrared photosensitive diodes 300, and a plurality of pixel units 400, where the near infrared organic light-emitting diodes and the pixel units are arranged alternatively to be spaced from each other in a number of patterns as needed; and the near infrared photosensitive diodes and the pixel units are arranged alternatively to be spaced from each other in a number of patterns as needed, although the embodiments of the disclosure will not be limited thereto.

The arrangement pattern of the near infrared organic light-emitting diodes 200, the near infrared photosensitive diodes 300, and the pixel units 400 will be described below by way of an example.

In an embodiment of the disclosure, as illustrated in FIG. 3, when each near infrared photosensitive diode 300 is arranged below one of the near infrared organic light-emitting diodes 200, the near infrared organic light-emitting diodes 200, and the near infrared photosensitive diodes 300 right below the near infrared organic light-emitting diodes 200 are arranged to be spaced from the pixel units 400 alternately in the same direction.

The near infrared organic light-emitting diodes 200, and the near infrared photosensitive diodes 300 right below the near infrared organic light-emitting diodes 200 are arranged to be spaced from the pixel units 400 alternately in the same direction so that the pixel units 400 and the near infrared organic light-emitting diodes 200 are arranged alternately in each row, and for example, each of the pixel units 400 can include three organic light-emitting sub-pixels, e.g., a red organic light-emitting sub-pixel 401, a green organic light-emitting sub-pixel 402, and a blue organic light-emitting sub-pixel 403, so every two near infrared organic light-emitting diodes 200 are spaced from each other by a red organic light-emitting sub-pixel 401, a green organic light-emitting sub-pixel 402, and a blue organic light-emitting sub-pixel 403. Here the embodiments of the disclosure will not be limited thereto as long as the pixel units 400 and the near infrared organic light-emitting diodes 200 are arranged to be spaced from each other in the row direction or the column direction or both of them so that the pixel units 400 can be arranged uniformly on the display panel, and the near infrared organic light-emitting diodes 200 can be arranged uniformly on the display panel.

In another embodiment of the disclosure, as illustrated in FIG. 4, when each near infrared photosensitive diode 300 is arranged below one of the near infrared organic light-emitting diodes 200, the near infrared organic light-emitting diodes 200, and the near infrared photosensitive diodes 300 right below the near infrared organic light-emitting diodes 200 are arranged to be spaced from each other in a direction perpendicular to the direction of the pixel units 400.

The near infrared organic light-emitting diodes 200, and the near infrared photosensitive diodes 300 right below the near infrared organic light-emitting diodes 200 are arranged to be spaced from each other in the direction perpendicular to the direction of the pixel units 400 so that rows of the pixel units 400, and rows of the near infrared organic light-emitting diodes 200 are arranged alternately, where for example, each of the pixel units 400 can include three organic light-emitting sub-pixels, e.g., a red organic light-emitting sub-pixel 401, a green organic light-emitting sub-pixel 402, and a blue organic light-emitting sub-pixel 403. Here the embodiments of the disclosure will not be limited thereto as long as the pixel units 400 and the near infrared organic light-emitting diodes 200 are arranged to be spaced from each other in the row direction or the column direction or both of them so that the pixel units 400 can be arranged uniformly on the display panel, and the near infrared organic light-emitting diodes 200 can be arranged uniformly on the display panel.

In still another embodiment of the disclosure, as illustrated in FIG. 5, when each near infrared photosensitive diode 300 is arranged at the same layer as one of the near infrared organic light-emitting diodes 200, that is, the near infrared photosensitive diodes 300 and the near infrared organic light-emitting diodes 200 are located on the base substrate 02, the near infrared organic light-emitting diodes 200, the near infrared photosensitive diodes 300 and the pixel units are arranged alternately to be spaced from and parallel to each other at the same layer.

As illustrated in FIG. 5, they are arranged alternately to be spaced from each other so that a near infrared organic light-emitting diode 200 or a near infrared photosensitive diode 300 is arranged between two sets of three sub-pixels of a pixel unit 400 (e.g., a red organic light-emitting sub-pixel 401, a green organic light-emitting sub-pixel 402, and a blue organic light-emitting sub-pixel 403) in each row, and a near infrared organic light-emitting diode 200 and a near infrared photosensitive diode 300 are arranged alternately between two sets of three sub-pixels of a pixel unit 400 in the row direction, or the near infrared organic light-emitting diodes 200 and the near infrared photosensitive diodes 300 are arranged at a quantity proportion of 1:2, so that the near infrared organic light-emitting diodes 200, the near infrared photosensitive diodes 300, and the pixel units 400 can be distributed uniformly on the display panel. Of course, they can be arranged alternately to be spaced from each other in another direction than the distribution pattern as illustrated in FIG. 5.

Figure 6:
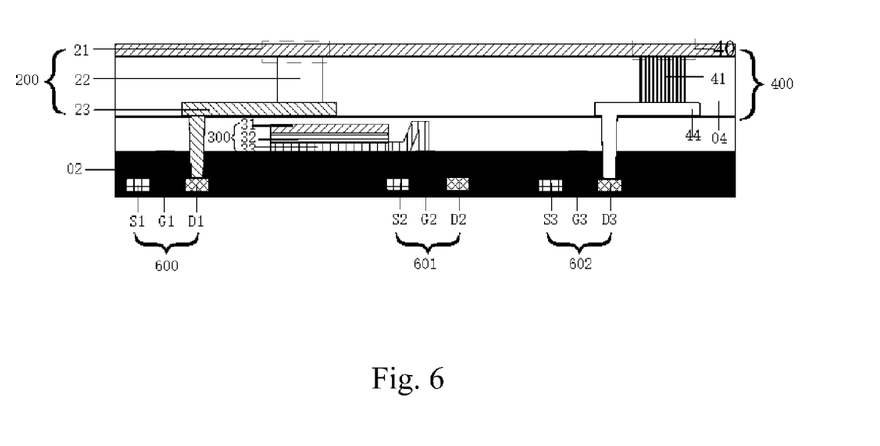
FIG. 6 is a schematic structural diagram of thin film transistors above a base substrate of the display panel according to the embodiments of the disclosure.

Furthermore, as illustrated in FIG. 6, in the display panel above according to the embodiments of the disclosure, a plurality of Thin Film Transistors (TFTs) can be further formed on the base substrate 02 to drive the near infrared organic light-emitting diodes 200, the near infrared photosensitive diodes 300 and the pixel units 400, and particularly the TFTs include $TFT_{NIRs}$ 600 for driving the near infrared organic light-emitting diodes 200, $TFT_{sensors}$ 601 for driving the near infrared photosensitive diodes 300, and $TFT_{RGBs}$ 602 for driving the pixel units 400. In FIG. 6, S1 represents a source of a $TFT_{NIR}$ 600, G1 represents a gate of the $TFT_{NIR}$ 600, and D1 represents a drain of the $TFT_{NIR}$ 600; S2 represents a source of a $TFT_{sensor}$ 601, G2 represents a gate of the $TFT_{sensor}$ 601, and D2 represents a drain of the $TFT_{sensor}$ 601; and S3 represents a source of a $TFT_{RGB}$ 602, G3 represents a gate of the $TFT_{RGB}$ 602, and D3 represents a drain of the $TFT_{RGB}$ 602. The other reference numerals are the same as those of the elements as illustrated in FIG. 1 and FIG. 2.

Furthermore, in a particular implementation, as illustrated in FIG. 6, in the display panel above according to the embodiments of the disclosure, the first electrodes 23 of the near infrared organic light-emitting diodes 200 are electrically connected with the drains D1 of the $TFT_{NIRs}$ 600; the fifth electrodes 33 of the near infrared photosensitive diodes 300 are electrically connected with the gates G2 of the $TFT_{sensors}$ 601; and the third electrodes 44 of the pixel units 400, e.g., red organic light-emitting sub-pixels, are electrically connected with the drains D3 of the $TFT_{RGBs}$ 602. Of course, the TFTs on the base substrate 02 can be connected with the near infrared organic light-emitting diodes 200, the near infrared photosensitive diodes 300, and the pixel units 400 in a number of ways as needed as long as the near infrared organic light-emitting diodes 200, the near infrared photosensitive diodes 300, and the pixel units 400 can be driven to operate normally, although the embodiments of the disclosure will not be limited thereto.

Based upon the same inventive concept, the embodiments of the disclosure further provide a display device including the display panel according to the embodiments above of the disclosure. The display device can be a mobile phone, a tablet computer, a TV set, a monitor, a notebook computer, a digital photo frame, a navigator, or any other product or component with a display function. All the other components indispensable to the display device shall readily occur to those ordinarily skilled in the art, and a repeated description thereof will be omitted here, but the embodiments of the disclosure will not be limited thereto. Reference can be made to the embodiments of the display panel above for an implementation of the display device, and a repeated description thereof will be omitted here.

Furthermore, in a particular implementation, in the display panel above according to the embodiments of the disclosure, a layer at which the near infrared organic light-emitting diodes 200 and the pixel units 400 are located as illustrated in FIG. 1 and FIG. 2 can be referred to as an organic light-emitting pixel layer.

Figure 7:
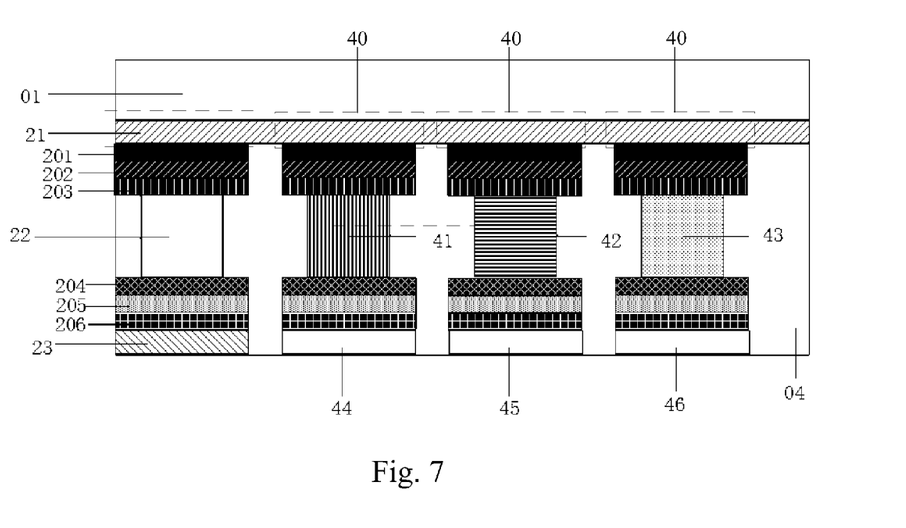
FIG. 7 is a schematic structural diagram of an organic material layer in the display panel according to the embodiments of the disclosure.

Furthermore as illustrated in FIG. 7, in a particular implementation, in the display panel above according to the embodiments of the disclosure, the organic light-emitting pixel layer can further include electron injection layers 201, electron transport layers 202, and hole blocking layers 203 additionally arranged below the second electrodes 21 and the fourth electrodes 40 in that order, or electron blocking layers 204, hole transport layers 205, and hole injection layers 206 additionally arranged above the first electrodes 23, the third electrodes 44 or 45 or 46 in that order, in addition to an upper electrode layer (a layer at which the second electrodes 21 and the fourth electrodes 40 are located), an RGB pixel light-emitting layer (a layer at which red pixel light-emitting layers 41, green pixel light-emitting layer 42, and blue pixel light-emitting layers 43 are located) and/or a near infrared organic light-emitting diode light-emitting layer (a layer at which the near infrared light-emitting layers 22 are located) and a bottom electrode layer (a layer at which the first electrodes 23 and the third electrodes 44 or 45 or 46 are located), as illustrated in FIG. 7, where the additionally arranged layers can be made of an organic material, for example. Particularly the additionally arranged layers and their materials can be designed and configured as needed, although the embodiments of the disclosure will not be limited thereto. The other reference numerals in FIG. 7 are the same as those of the elements as illustrated in FIG. 1 and FIG. 2.

Furthermore, in a particular implementation, in the display panel above according to the embodiments of the disclosure, the near infrared organ light-emitting diodes, the pixel units, and the near infrared photosensitive diodes are made of an organic material, thus lowering the complexity of selecting their material, and improving the process compatibility.

Figure 8:
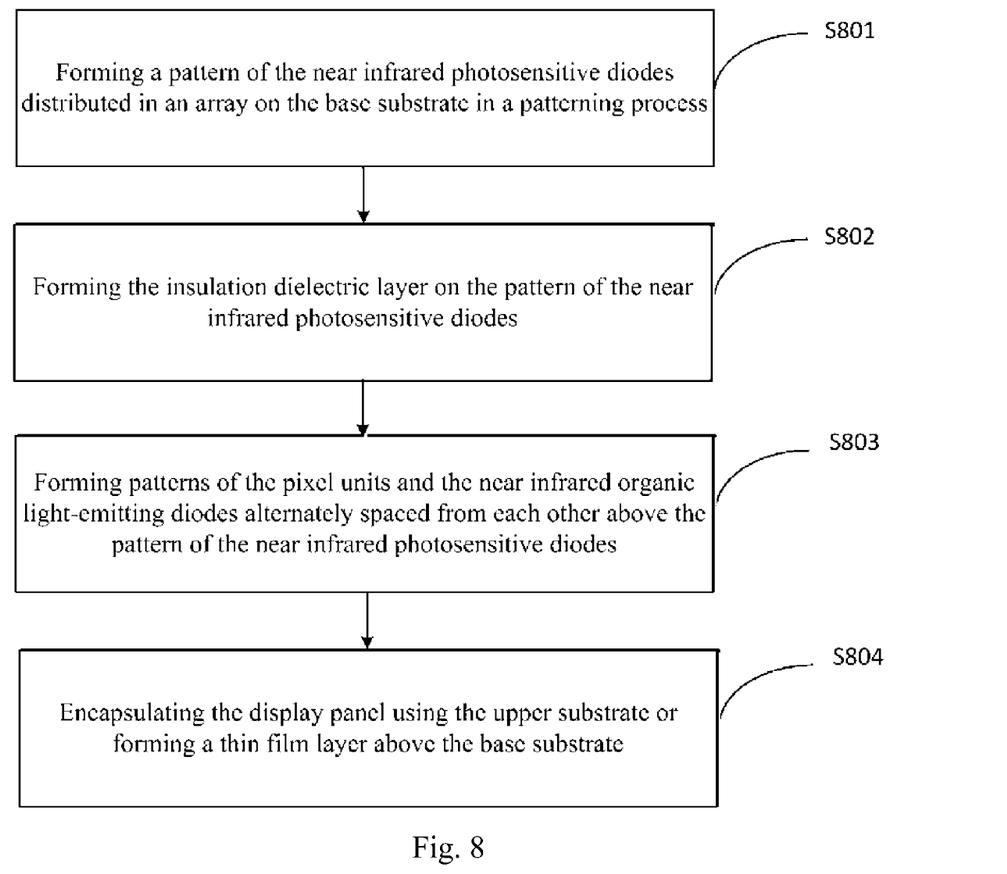
FIG. 8 is a flow chart of a process of fabricating the display panel according to the embodiments of the disclosure.

Based upon the same inventive concept, as illustrated in FIG. 8, the embodiments of the disclosure further provide a process of fabricating a display panel, where the process includes: fabricating a base substrate; and fabricating near infrared organic light-emitting diodes, pixel units, and near infrared photosensitive diodes above the base substrate.

Particular operations are as follows.

The operation S801 is to form a pattern of the near infrared photosensitive diodes 300 distributed in an array on the base substrate 02 in a patterning process. In a particular implementation, a photosensitive material of the near infrared photosensitive diodes 300 can be an organic material, e.g., a dithiolene material, such as BDN (bis(4-dimethylaminodithiobenzil) nickd(II)), a polymer of benzotriazole, such as PTZBTTT-BDT, a small molecule material of porphyrin, such as DHTBTEZP, etc. This operation can alternatively be performed through printing, inkjet printing, transfer-printing, etc.

The operation S802 is to form the insulation dielectric layer 06 on the pattern of the near infrared photosensitive diodes 300. In a particular implementation, the insulation dielectric layer can be made of a polymer, silicide, etc., or another material, and formed through printing, inkjet printing, transfer-printing, chemical vapor deposition, etc, and electrode through-holes can be formed in a photolithographic process including exposure, development, etching, etc. The first electrodes 23 and the third electrodes 44 or 45 or 46 are formed on the insulation dielectric layer 06 through sputtering, photolithography or another patterning process. The pixel definition layer 04 can be formed on the electrode layers in a photolithographic process, and the material of the pixel definition layer 04 can be an organic material, e.g., polyimide, phenolic resin, etc.

The operation S803 is to form patterns of the pixel units 400 and the near infrared organic light-emitting diodes 200 alternately spaced from each other above the pattern of the near infrared photosensitive diodes 300. Particularly, a pattern of the hole injection layers 206 as illustrated in FIG. 7 is formed on surfaces of anodes (the first electrodes 23 and the third electrodes 44 or 45 or 46) in a patterning process, a pattern of the hole transport layers 205 is formed on surfaces of the hole injection layers 206 in a patterning process, and patterns of the electron blocking layers 204, the RGB pixel light-emitting layer (the layer where the red pixel light-emitting layers 41, the green pixel light-emitting layers 42, and the blue pixel light-emitting layers 43 are located) and/or the near infrared light-emitting layer (the layer where the near infrared light-emitting layer 22 is located), the hole blocking layers 203, the electronic transport layers 202, the electron injection layers 201, and the second electrodes 21 are formed in a stack in that order, thus resulting in a pattern of the organic light-emitting elements. In a particular implementation, the additionally arranged layers can be made of an organic material for example, and formed through thermal vapor-deposition, inkjet printing, laser transfer-printing, etc.

The operation S804 is to encapsulate the display panel using the upper substrate 01. In a particular implementation, alternatively a thin film layer can be formed directly above the resulting base substrate 02 as an encapsulation layer instead of using the upper substrate 01.

In summary, in the display panel and the display device according to the embodiments of the disclosure, the infrared light sources, the pixel units, and the infrared photosensitive sensors are arranged on the base substrate to thereby extend an area for recognizing a fingerprint or a palmprint instead of only a fixed area in which a fingerprint can be recognized as in the related art, so as to recognize a fingerprint or a palmprint throughout the screen while improving the precision of recognizing light rays; and on the other hand, the infrared light sources and the infrared photosensitive sensors are integrated in the screen, so no light sources for recognizing a fingerprint will be additionally arranged, thus lowering the complexity of assembling, and enabling a mobile phone to be light-weighted and flexible.

Evidently those skilled in the art can make various modifications and variations to the invention without departing from the spirit and scope of the disclosure. Thus the invention is also intended to encompass these modifications and variations thereto so long as the modifications and variations come into the scope of the claims appended to the invention and their equivalents.

The invention claimed is:
1. A display panel, comprising:
a base substrate;
a plurality of pixel units on the base substrate; and
a plurality of infrared light sources and a plurality of infrared photosensitive sensors distributed between the plurality of pixel units;
wherein
the plurality of infrared light sources comprise near infrared organic light-emitting diodes, and the plurality of infrared photosensitive sensors comprise near infrared photosensitive diodes; and
the near infrared photosensitive diodes each is located right below each of the near infrared organic light-emitting diodes, in a direction from the base substrate to the near infrared photosensitive diodes; and
wherein an area of orthographic projection of each near infrared photosensitive diode onto the base substrate is greater than an area of orthographic projection of each near infrared organic light-emitting diode onto the base substrate;

wherein an overlapping spectrum exists between an emission spectrum of each of the plurality of infrared light sources, and an absorption spectrum of each of the plurality of infrared photosensitive sensors.

2. The display panel according to claim 1, wherein the plurality of pixel units comprise a plurality of organic light-emitting sub-pixels.

3. The display panel according to claim 2, wherein each of the near infrared organic light-emitting diodes comprises a first electrode, a near infrared light-emitting layer, and a second electrode stacked on the base substrate in that order;
each of the plurality of organic light-emitting sub-pixels comprises a third electrode, a pixel light-emitting layer, and a fourth electrode stacked on the base substrate in that order; and
the first electrode is arranged at a same layer as the third electrode, and the second electrode is arranged at a same layer as the fourth electrode.

4. The display panel according to claim 3, wherein the second electrode is formed integrally with the fourth electrode.

5. The display panel according to claim 1, wherein each of the near infrared photosensitive diodes comprises a fifth electrode, a near infrared photosensitive layer, and a sixth electrode stacked on the base substrate in that order; each of the near infrared organic light-emitting diodes comprises a first electrode, a near infrared light-emitting layer, and a second electrode stacked on the base substrate in that order.

6. The display panel according to claim 1, wherein the plurality of infrared light sources are distributed uniformly among the plurality of pixel units; and the plurality of infrared photosensitive sensors are distributed uniformly among the plurality of pixel units.

7. The display panel according to claim 6, wherein a number of infrared photosensitive sensors is same as a number of infrared light sources.

8. The display panel according to claim 1, wherein the base substrate is a flexible substrate.

9. The display panel according to claim 1, wherein an emission spectrum of each of the near infrared organic light-emitting diodes ranges from 780 nm to 2500 nm.

10. The display panel according to claim 1, wherein the display panel further comprises:
a plurality of Thin Film Transistors (TFTs) on the display substrate to drive the near infrared organic light-emitting diodes, the near infrared photosensitive diodes and the plurality of pixel units;
wherein the plurality of TFTs comprises: first TFTs to drive the near infrared organic light-emitting diodes, second TFTs to drive the near infrared photosensitive diodes and third TFTs to drive the plurality of pixel units.

11. The display panel according to claim 10, wherein
each of the near infrared organic light-emitting diodes comprises a first electrode, a near infrared light-emitting layer, and a second electrode stacked on the display substrate in that order;
each of the near infrared photosensitive diodes comprises a third electrode, a near infrared photosensitive layer, and a fourth electrode stacked on the display substrate in that order; and
the first electrode of each of the near infrared organic light-emitting diodes is electrically connected with a drain of a corresponding first TFT; the third electrode of each of the near infrared photosensitive diodes is electrically connected with a gate of a corresponding second TFT.

12. The display panel according to claim 10, wherein each of the near infrared photosensitive diodes comprises a third electrode, a near infrared photosensitive layer, and a fourth electrode stacked on the display substrate in that order;
each of the near infrared organic light-emitting diodes comprises a first electrode, a near infrared light-emitting layer, and a second electrode stacked on the fourth electrode in that order; and
orthographic projections of respective near infrared photosensitive layers onto the base substrate cover orthographic projections of respective near infrared light-emitting layers onto the base substrate.

13. A display device, comprising a display panel; wherein the display panel comprises:
a base substrate;
a plurality of pixel units on the base substrate; and
a plurality of infrared light sources and a plurality of infrared photosensitive sensors distributed between the plurality of pixel units;
wherein
the plurality of infrared light sources comprise near infrared organic light-emitting diodes, and the plurality of infrared photosensitive sensors comprise near infrared photosensitive diodes; and
the near infrared photosensitive diodes each is located right below each of the near infrared organic light-emitting diodes, in a direction from the base substrate to the near infrared photosensitive diodes; and wherein an area of orthographic projection of each near infrared photosensitive diode onto the base substrate is greater than an area of orthographic projection of each near infrared organic light-emitting diode onto the base substrate;
wherein an overlapping spectrum exists between an emission spectrum of each of the plurality of infrared light sources, and an absorption spectrum of each of the plurality of infrared photosensitive sensors.

* * * * *